United States Patent [19]

Bilotti et al.

[11] 3,896,383

[45] July 22, 1975

[54] A.C. COUPLING NETWORK

[75] Inventors: Alberto Bilotti, Buenos Aires, Argentina; Ronald W. Lutz, Holden, Mass.

[73] Assignee: Sprague Electric Company, North Adams, Mass.

[22] Filed: June 19, 1973

[21] Appl. No.: 371,421

[52] U.S. Cl. ................ 325/347; 325/488; 325/492; 330/177; 330/180

[51] Int. Cl. ............................................ H04b 1/16

[58] Field of Search ........... 325/318, 319, 492, 344, 325/485, 488; 179/1 A, 1 D; 330/16, 22, 21, 38 M, 40, 149, 152, 157, 177, 180, 199, 204

[56] References Cited

UNITED STATES PATENTS

| | | | |
|---|---|---|---|
| 2,364,403 | 12/1944 | Terman | 330/149 |
| 3,060,264 | 10/1962 | Rojprasit | 179/1 A |
| 3,389,344 | 6/1968 | Fichtner | 330/149 X |
| 3,562,445 | 2/1971 | McCanney | 179/1 A |
| 3,665,317 | 5/1972 | Crow | 330/38 M |

*Primary Examiner*—Benedict V. Safourek
*Attorney, Agent, or Firm*—Connolly and Hutz

[57] ABSTRACT

An FM receiver sound channel network is presented wherein a single capacitor serves the dual roles of, filtering out amplifier bias circuit ripple, and providing a.c. interstage coupling between the detector and the audio amplifier. This circuit is especially suitable where most of the components of the sound channel take the form of an integrated circuit.

4 Claims, 2 Drawing Figures

A.C. COUPLING NETWORK

BACKGROUND OF THE INVENTION

This invention pertains to electrical audio signal amplifying circuits, and more particularly to the sound channel portion of frequency modulated (FM) and television receivers. In FM and television receivers, the FM signal is normally taken from an antenna to a receiver front-end circuit that may be comprised of a tunable radio frequency (RF) circuit stage and a mixer stage. A tunable local oscillator circuit is mechanically ganged to the tuning mechanism of the RF stage such that the difference between the two signal frequencies remains constant over the tuning range. This difference or intermediate frequency (IF) signal is then connected to a fixed tuned IF amplifier stage and to a limiter circuit which clips and stabilizes the IF signal amplitude. From there it is sent to a discriminator or detector stage where the signal is demodulated. The audio frequency demodulated signal is then coupled to an audio amplifier and finally to an electro-acoustic transducer or speaker. The sound channel portion of such FM receivers is defined herein as a network including a limiter, detector and audio amplifier.

In FM receivers particularly, it is conventional to employ a.c. rather than d.c. coupling between the detector and the amplifier because the detector output voltage is necessarily proportional to its input frequency at any instant of time. Therefore the d.c. level at the detector output will vary with the point of tuning. This d.c. voltage component, without a.c. coupling could vary the bias on the audio amplifier over a wide range thus causing it to operate well away from its optimum gain bias point. When a capacitor is used to achieve a.c. coupling, a bias circuit comprising a resistor voltage divider across the system's d.c. power supply is usually provided for biasing the input of the amplifier at a desired voltage, usually about half the supply voltage. This biasing means causes the quiescent output voltage to track and remain proportional to the supply voltage, which feature is greatly advantageous when the amplifier circuit itself employs interstage d.c. coupling. However, any ripple voltage appearing at the power supply will also appear, somewhat attenuated, at the amplifier input. This problem is commonly overcome by adding at least another large capacitor to the bias network to filter out the ripple. Alternatively, instead of adding the filtering components, the bias voltage may be obtained from a voltage regulating network including for example voltage regulating zener diodes. This serves to get rid of the unwanted ripple, but it results in a fixed bias. In addition such regulated voltage must supply both the bias network and the amplifier so that bias and amplifier supply voltages always remain in the same ratio.

The use of integrated circuits in the sound channel portion of TV receivers has recently become rather common. To minimize the cost of such systems, their design is usually directed toward the use of circuit elements and components that are, to the maximum extent possible, capable of being formed in a single integrated silicon crystal body. Thus the number of conventional discrete components necessary to complete the system are kept to a minimum. The necessary capacitors for audio coupling or ripple de-coupling are typically 0.1 and 100 microfarads, respectively. Such large capacitors cannot be made as a practical matter in integrated circuit form.

It is therefore an object of this invention to provide a low cost a.c. interstage coupling and bias circuit wherein bias power supply ripple voltage is greatly attenuated.

It is a further object of this invention to provide an integrated circuit sound channel, requiring a minimum number of attached discrete components.

SUMMARY OF THE INVENTION

A coupling capacitor is connected between a low impedance signal source and a high input impedance amplifier. A high impedance circuit, at least partially comprised of a resistor circuit connected to the main power supply, provides bias to the amplifier input. Power supply ripple is effectively bypassed from the input of the amplifier by being shunted through the coupling capacitor and the low output impedance at the signal source. The use of this network in an integrated FM or TV receiver sound channel circuit is also disclosed.

DESCRIPTION OF THE PREFERRED EMBODIMENT

Figure 1:
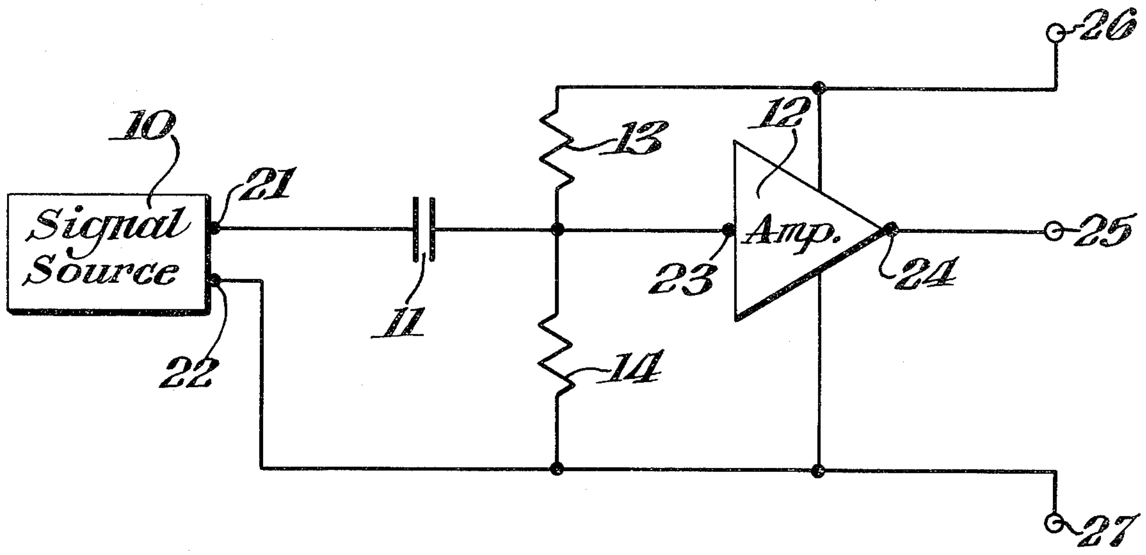
FIG. 1 shows a schematic diagram of an audio signal source coupled through a capacitor to a biased amplifier according to a first embodiment of this invention.

A first preferred embodiment of the present invention is shown in schematic form in FIG. 1. Block 10 represents a source of electrical signals in the audio frequency spectrum. The signal voltage is developed at output terminal 21, relative to terminal 22 that is connected to terminal 27 and circuit ground. The signal is connected through coupling capacitor 11 to the input terminal 23 of an amplifier 12. A d.c. voltage supply (not shown) is connected between terminals 26 and 27, and by connection to the amplifier, supplies electrical energy thereto. The resistors 13 and 14 are connected in series and across the d.c. voltage supply, forming a voltage divider bias supply circuit. A bias voltage developed at the connection between resistors 13 and 14 is connected to the input terminal 23 of amplifier 12. Thus the bias supply, the power supply, the signal source 10, and the amplifier 12 all share a common ground connection at terminal 27. All circuit voltages will be stated with reference to the ground, as is conventional, unless otherwise specified.

The bias circuit in FIG. 1 is best represented as a d.c. supply and an a.c. ripple voltage in series, this series combination being connected btween terminals 26 and 27 so as to be further connected in series with resistors 13 and 14. The impedance of the bias circuit, as seen from the input terminal 23 (and ground 27), is conveniently determined by considering the well known thevenin equivalent circuit of the bias circuit. The bias circuit impedance value is thus equal to the parallel combination of resistors 13 and 14 in FIG. 1. It can now be seen by inspection that when the bias circuit impedance is equal to the input impedance of amplifier 12, and is ten times greater than the impedance of the signal source 10, and is also ten times greater than the impedance of the capacitor at the ripple frequency, then the dominant path for ripple current will be through resistor 13, capacitor 11, and the signal source 10 to ground. Under these conditions the ripple voltage appearing at terminal 23 will be attenuated by about a factor of 9 relative to the magnitude of the ripple voltage as originally generated at the power supply.

Under these same conditions it is apparent that for a signal voltage at terminal 21, having a frequency equal to that of the ripple voltage, the signal voltage attenuation at terminal 23 relative to that at terminal 21 is about 3 percent. When this coupling network is the sole factor that determines the low frequency characteristic of the transfer function of the audio circuit of FIG. 1, from terminal 21 to terminal 25, then the low frequency 6db down point lies well below the ripple frequency.

Therefore for the conditions that the signal source 10 has a low output impedance, the amplifier 12 has a high input impedance, the coupling capacitor 11 has a low impedance at the lowest signal frequency to be amplified and at the ripple frequency, and the bias circuit has a high impedance; then the ripple voltage generated by the power supply is attenuated at the amplifier input 23 and the signal voltage generated at the signal source 10 is substantially faithfully reproduced and coupled to the amplifier input 23 provided said high impedances are at least ten times greater than said low impedances.

Figure 2:
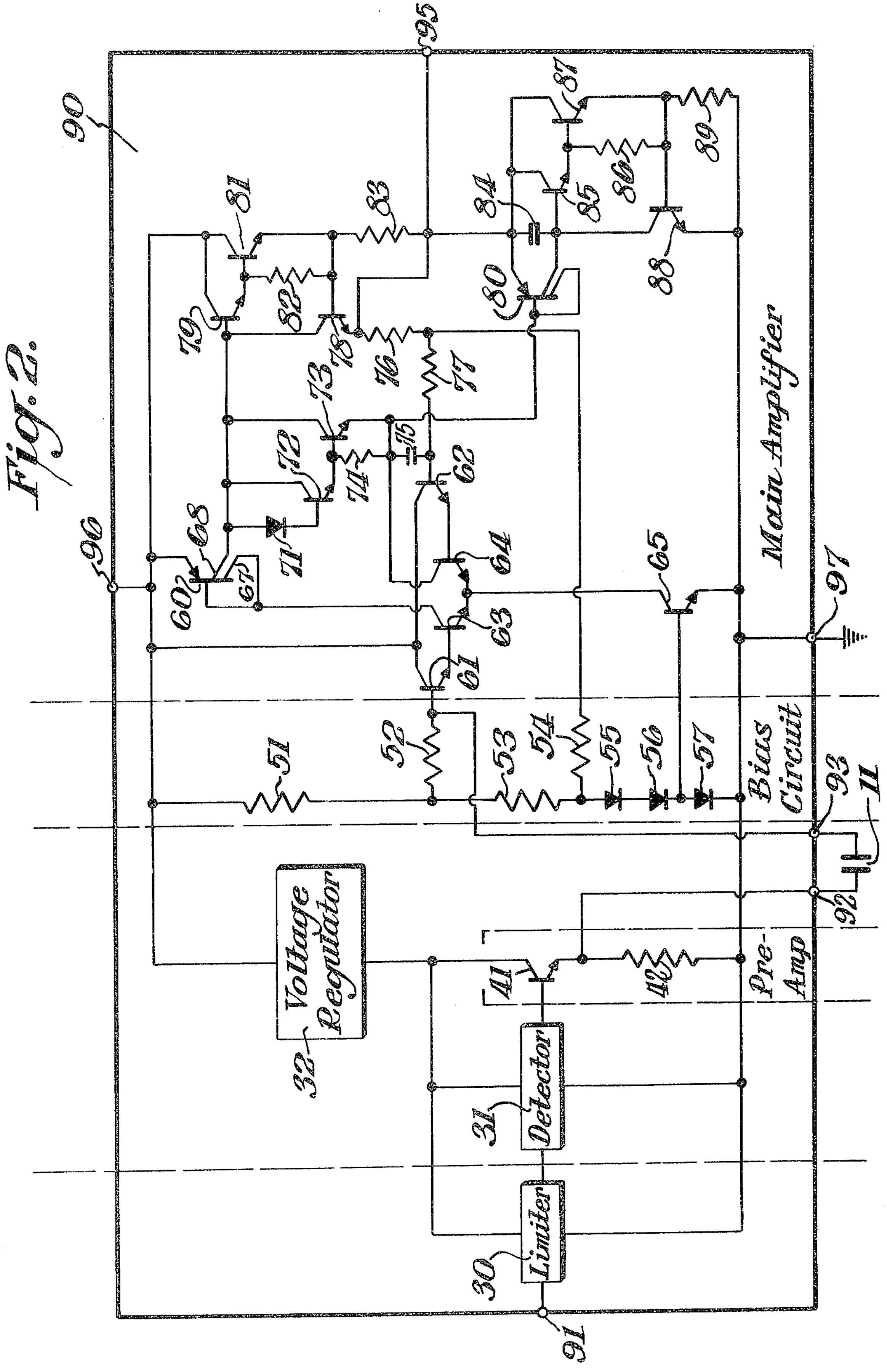
FIG. 2 shows a schematic diagram of an integrated circuit connected by an external capacitor so as to form an FM receiver sound channel network according to a second embodiment of this invention.

A second preferred embodiment is shown in FIG. 2, representing a sound channel in a television or FM receiver. The portion of the circuit 90 enclosed by the heavy line represents a silicon integrated circuit, except for a few external components (not shown) associated with the detector 31 such as a gain control. Terminals 91, 92, 93, 95, 96 and 97 represent electrodes or terminals on the integrated circuit silicon body for external access.

The limiter circuit 30 provides about 75 *db* of gain to the I.F. (4.5 MHz) F.M. signal, generated in a television receiver (not shown), that is connected to terminal 91. This clipped and amplified signal is connected from the limiter to a quadrature detector 31 that demodulates the F.M. signal and provides the demodulated audio signal to the base of transistor 41. Transistor 41 is an active element in a preamplifier circuit whose d.c. collector voltage is provided from an on-board (integrated) voltage regulator circuit 32. The same regulator also supplies regulated voltage to the limiter 30 and the detector 31. Amplifier transistor 41 has an emitter resistor 42 connected to ground, terminal 97. The resistor 42 and transistor 41 form an emitter follower circuit having a low output impedance, from emitter to ground, (typically about 100 ohms).

The bias circuit is composed of six components. Resistor 51 has one end connected to the positive terminal 96 of the d.c. power supply (not shown). Resistor 53 is connected in series with resistor 51, diodes 55, 56, and 57. Diode 57 is further connected to the ground terminal 97. Terminal 97 is also the negative power supply terminal. The bias voltage developed at the junction of resistors 51 and 53 is connected through a large value resistor 52 to the base of transistor 61, representing the input of the main amplifier circuit. For the sake of simplifying the circuitry, the diodes 55, 56 and 57 are shown simply series connected so as to provide an intermediate bias of about 2 volts. In actual practice this is better accomplished by supplying a constant current to the diode string and interposing a darlington pair between the diode string and the bottom of resistor 53. This advantageously provides the same voltage and a very low source impedance.

An external discrete coupling capacitor 11, is connected between the emitter of transistor 41 representing the output of the preamplifier circuit, and the input of the main amplifier circuit. Bonding pads or terminals 92 and 93 are provided on the integrated circuit body for making the capacitor connections.

The first stage of the main amplifier is comprised of the pair of transistors 61 and 63 connected in standard differential fashion with the pair of transistors 62 and 64. Each pair is interconnected in standard darlington fashion providing high input impedance (on the order of 1 megohm or higher).

The collectors of transistors 61 and 62 are both tied to the positive power supply terminal 96. Transistor 65 has its base connected to reference diode 57 in a conventional current source configuration. Thus the emitters of transistors 63 and 64 are supplied by a current source from the ground 97.

The dual collector PNP transistor 60 is connected in a standard unity gain configuration. Its emitter is connected to the positive power supply terminal 96. One of its collectors 67 is tied to its base and then further connected to the collector of transistor 63. The magnitude of current flowing in the collector of transistor 63 is thus nearly equal to the magnitude of current flowing in the other collector 68 of transistor 60.

The circuit components comprised of diode 71, transistors 72 and 73 and resistor 74 cooperate to cause a voltage to be maintained between the collector of transistor 64 and collector 68 of transistor 60. This voltage matches the base-emitter thresholds of the output transistors 79, 80 and 81 so as to bias and maintain the output transistors at a constant current level. An audio signal is developed at the bases of transistors 79 and 80 by differential action of transistor 61 through 64.

At this point it is convenient to think of the group of circuit components composed of transistors 78, 79 and 81, and resistors 82 and 83 as acting together to form half of a current limited type A–B push-pull power amplifier stage. Likewise it is convenient to think of the group of components composed of transistors 80, 85, 87 and 88, and resistors 86 and 89 as the other half of the current limited type A–B push-pull power amplifier stage. The output of this stage appears between output terminal 95 and ground 97.

The differential amplifier with its high emitter circuit impedance, represented by the current source, provides high common mode rejection such that power supply ripple voltage is effectively prevented from being superimposed on the amplified signal.

The bias at the base of transistor 62 is about 2.6 volts, being obtained through resistor 77 from the degenerative feedback of resistors 76 and 54. Resistor 76 is connected between the output terminal 95 and returned to the inverting input of the differential amplifier through resistor 77. Resistor 54 completes the negative feedback circuit and is connected to the junction of resistor 77 and 76, and is returned to the bias reference represented by diodes 55 through 57. Resistors 76 and 54 then serve to set the closed loop gain of the amplifier at approximately 26 *db*. The capacitor 75 serves in conjunction with resistor 77 to establish a pole in the open loop response thus ensuring stable non-oscillatory operation. Similarly capacitor 84 stabilizes the aforementioned second half of the push-pull power amplifier stage.

A network according to the second preferred embodiment was constructed. The silicon integrated circuit employed planar diffused transistors having identical structures and characteristics. The values of resistors are given in the table below. Those having an asterisk beside the value were ion implanted, whereas the rest were formed simultaneously with transistor base diffusion. Transistors were formed in epitaxial silicon having a thickness of from 12 to 14 microns and a resistivity of about 2.2 ohm-centimeters. Base depths were about 3.3 microns. The current gain of NPN transistors was from 50 to 200 while for PNP transistors it was about 15. Diodes were formed as standard transistors with base to collector shorted. Capacitors 75 and 84 are normal collector-base junction capacitors. The 0.5 ohm resistors were formed by using the low resistivity emitter diffusion.

| Resistors | | Capacitors | |
|---|---|---|---|
| 42 | 5 K ohms | 11 | 0.57 μfd |
| 51 | 23.5 K | 75 | 8 pfd |
| 52 | 50 K | 84 | 5 pfd |
| 53 | 0.6 K | | |
| 54 | 0.5 K | | |
| 74 | 6 K | | |
| 76 | 10 K | | |
| 77 | 50 K | | |
| 82 | 6 K | | |
| 83 | 0.5 ohm | | |
| 86 | 6 K | | |
| 89 | 0.5 ohm | | |

This circuit was made on a silicon chip having the dimensions 0.088×0.072 inches. The amplifier delivers 2 watts into a 16 ohm load at less than 5 percent third harmonic distortion. An 18 to 27 volt power supply is used. The 120 Hz ripple voltage generated in series with the power supply terminal 96 is attenuated by 26 *db* at the output terminal 95. Ripple voltage of 0.05 volts rms on terminal 95 appears when 1 volt rms of ripple at 120 Hz is introduced at terminal 96. The main amplifier has a frequency response of 25 Hz to 90,000 Hz for element values shown in the table.

Although the preferred embodiments of this invention have been shown applied to circuits that transmit audio frequency signals, the principles of this invention are equally applicable to a broad range of signal handling problems wherein interstage capacitive coupling is desirable, and ripple or noise generated at the power supply needs to be diverted from the input of the receiving stage. For example broad spectrum or video amplifiers having an upper cutoff frequency well above the audio range may advantageously employ these principles. The preferred embodiments are presented as examples of their application and the scope of the invention is to be limited only by the appended claims.

What is claimed is:

1. A method for coupling an electrical signal from a signal source to the input of an amplifier comprising:

a. providing a signal source having a low output impedance;

b. providing an amplifier circuit with a high input impedance;

c. connecting a d.c. power supply containing an a.c. ripple to said amplifier for providing power thereto;

d. connecting a coupling capacitor between said output of said signal source and said input of said amplifier; and e. connecting a high impedance d.c. bias circuit directly to and powered by said d.c. power supply for the purpose of providing a bias at said input of said amplifier, said bias circuit, said amplifier and said signal source having a common reference ground connection, said coupling capacitor having a low impedance at the lowest signal frequency to be amplified and having a low impedance at the frequency of ripple in said bias circuit, wherein each said high impedance is at least ten times greater than any of said low impedances, such that any ripple currents present in said bias circuit are substantially shorted to ground through said coupling capacitor and said output impedance of said signal source, and such that essentially only the amplified signal appears at the output of said amplifier.

2. The method of claim 1 additionally comprising forming at least a portion of the components making up said signal source, said amplifier and said bias circuit in the body of a silicon crystal by a normal integrated circuit fabrication process.

3. The method of claim 2 additionally comprising forming said coupling capacitor as a discrete circuit element and wherein said connecting of said coupling capacitor between said signal source and said amplifier is accomplished by attaching said capacitor to said integrated circuit.

4. The method of claim 2 wherein said signal source is comprised of an FM limiter circuit, an FM detector circuit and a preamplifier circuit; additionally comprising applying an FM signal to the input of said detector, obtaining a demodulated audio frequency signal from the output of said detector and connecting said audio frequency signal to the input of said preamplifier, the output signal from said preamplifier representing said signal from said signal source such that said integrated circuit with said coupling capacitor is suitable for use as a sound channel in an FM or television receiver.

* * * * *